United States Patent
Kanda

(10) Patent No.: US 12,457,764 B2
(45) Date of Patent: Oct. 28, 2025

(54) SEMICONDUCTOR DEVICE AND METHOD FOR MANUFACTURING SEMICONDUCTOR DEVICE

(71) Applicant: Nuvoton Technology Corporation Japan, Kyoto (JP)

(72) Inventor: Yusuke Kanda, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 19/012,337

(22) Filed: Jan. 7, 2025

(65) Prior Publication Data

US 2025/0151310 A1     May 8, 2025

Related U.S. Application Data

(63) Continuation of application No. PCT/JP2023/027335, filed on Jul. 26, 2023.
(Continued)

(51) Int. Cl.
*H10D 30/47*     (2025.01)
*H10D 30/01*     (2025.01)
(Continued)

(52) U.S. Cl.
CPC ......... *H10D 30/471* (2025.01); *H10D 30/015* (2025.01); *H10D 62/8325* (2025.01); *H10D 62/8503* (2025.01)

(58) Field of Classification Search
CPC ............ H10D 30/471; H10D 30/015; H10D 62/8325; H10D 62/8503; H10D 62/149;
(Continued)

(56) References Cited

U.S. PATENT DOCUMENTS 5,917,209 A * 6/1999 Andoh ............ H01L 21/76898
257/E21.597
8,304,271 B2 * 11/2012 Huang ............... H10D 62/8503
257/E27.012
(Continued)

FOREIGN PATENT DOCUMENTS

JP   2008-226871 A   9/2008
JP   2009-033097 A   2/2009
(Continued)

OTHER PUBLICATIONS

Rao et al., "Characterization of hardness, elastic modulus and fracture toughness of RBSiC ceramics at elevated temperature by Vickers test," Materials Science & Engineering A 744 (2019) pp. 426-435.*
(Continued)

*Primary Examiner* — Jay C Kim
(74) *Attorney, Agent, or Firm* — Rimon P.C.

(57) ABSTRACT

A semiconductor device includes: a Si substrate; a back electrode provided below the Si substrate; a SiC layer provided above the Si substrate; a nitride semiconductor layer provided above the SiC layer; a source electrode and a drain electrode provided above the nitride semiconductor layer; a gate electrode in contact with the nitride semiconductor layer; an intermediate layer provided in an opening that creates an opening in the SiC layer and the nitride semiconductor layer; a metal layer provided above the opening so as to cover the intermediate layer; and a conductor that is provided inside a through via that penetrates the intermediate layer and the Si substrate and is electrically connected with the back electrode and the metal layer. The intermediate layer is a metal nitride layer or a silicon oxide layer.

10 Claims, 11 Drawing Sheets

Related U.S. Application Data

(60) Provisional application No. 63/392,691, filed on Jul. 27, 2022.

(51) Int. Cl.
  *H10D 62/832* (2025.01)
  *H10D 62/85* (2025.01)

(58) Field of Classification Search
  CPC .... H10D 62/357; H10D 30/021; H10D 30/60; H10D 62/83; H01L 21/76898; H01L 23/481
  See application file for complete search history.

(56) References Cited

U.S. PATENT DOCUMENTS

| | | | | |
|---|---|---|---|---|
| 8,350,288 | B2* | 1/2013 | Therrien | H01L 24/89 257/191 |
| 8,410,580 | B2* | 4/2013 | Hill | H01L 21/76898 257/621 |
| 9,362,198 | B2* | 6/2016 | Viswanathan | H10D 62/824 |
| 9,871,107 | B2* | 1/2018 | Green | H01L 23/5227 |
| 10,163,707 | B2* | 12/2018 | Chang | H10D 64/254 |
| 10,943,821 | B2* | 3/2021 | Kosaka | H01L 21/02642 |
| 10,971,612 | B2* | 4/2021 | Bothe | H01L 21/28575 |
| 11,411,099 | B2* | 8/2022 | Pu | H10D 30/0291 |
| 11,749,639 | B2* | 9/2023 | Viswanathan | H01L 24/83 257/621 |
| 2009/0001478 | A1 | 1/2009 | Okamoto | |
| 2009/0078943 | A1 | 3/2009 | Ishida et al. | |
| 2021/0183648 | A1* | 6/2021 | Kuball | H01L 21/7806 |
| 2022/0005945 | A1 | 1/2022 | Hishiki et al. | |

FOREIGN PATENT DOCUMENTS

| | | | |
|---|---|---|---|
| JP | 2009-076694 | A | 4/2009 |
| JP | 2013-179121 | A | 9/2013 |
| JP | 2013-243275 | A | 12/2013 |
| JP | 2015-070252 | A | 4/2015 |
| JP | 2020-072216 | A | 5/2020 |

OTHER PUBLICATIONS

Chicot et al., "Comparison of instrumented Knoop and Vickers hardness measurements on various soft materials and hard ceramics," Journal of the European Ceramic Society 27 (2007) pp. 1905-1911.*

Zeng et al., "Anneal-induced enhancement of refractive index and hardness of silicophosphate glasses containing six-fold coordinated silicon," Applied Physics Letters 106 (2015) 021903.*

Nastic et al., "Instrumented and Vickers Indentation for the Characterization of Stiffness, Hardness and Toughness of Zirconia Toughened Al2O3 and SiC Armor," Journal of Materials Science & Technology 31 (2015) pp. 773-783.*

Tsukamoto et al., "Mechanical Properties of Thin Films: Measurements of Ultramicroindentation Hardness, Young's Modulus and Internal Stress," Thin Solid Films, 154 (1987) pp. 171-181.*

Yonenaga, "Thermo-mechanical stability of wide-bandgap semiconductors: high temperature hardness of SiC, AlN, GaN, ZnO and ZnSe," Physica B 308-310 (2001) pp. 1150-1152.*

Geetha et al., "AFM studies of microindented GaN and InGaN show that a Vickers hardness varies with an applied load," Materials Letters 63 (2009) pp. 515-518.*

International Search Report dated Oct. 17, 2023 issued in International Patent Application No. PCT/JP2023/027335, with English translation.

Written Opinion of the International Searching Authority dated Oct. 17, 2023 issued in International Patent Application No. PCT/JP2023/027335, with English translation.

* cited by examiner

SEMICONDUCTOR DEVICE AND METHOD FOR MANUFACTURING SEMICONDUCTOR DEVICE

CROSS REFERENCE TO RELATED APPLICATIONS

This is a continuation application of PCT International Application No. PCT/JP2023/027335 filed on Jul. 26, 2023, designating the United States of America, which is based on and claims priority of U.S. Provisional Patent Application No. 63/392,691 filed on Jul. 27, 2022. The entire disclosures of the above-identified applications, including the specifications, drawings and claims are incorporated herein by reference in their entirety.

FIELD

The present disclosure relates to a semiconductor device and a method for manufacturing the semiconductor device. In particular, the present disclosure relates to a nitride semiconductor device using a group III nitride semiconductor and a method for manufacturing thereof.

BACKGROUND

A nitride semiconductor device that uses a group III nitride semiconductor, such as gallium nitride (GaN) and aluminum gallium nitride (AlGaN), has a high breakdown voltage due to a wide band gap between materials. Moreover, in the semiconductor device that uses a group III nitride semiconductor, a heterostructure of, for example, AlGaN/GaN can be readily formed.

In the AlGaN/GaN heterostructure, a difference between piezoelectric polarization caused by a lattice constant difference between the materials and spontaneous polarization of AlGaN and GaN causes a channel of highly-concentrated electrons (two dimensions electron gas (2DEG)) to be formed on the GaN layer side of the AlGaN/GaN interface. Since the above-described nitride semiconductor device that utilizes the two dimensions electron gas channel has a relatively high electron saturation velocity, a relatively high insulation resistance, and relatively high thermal conductivity, the above-described nitride semiconductor device is applied to high-frequency power devices.

This type of nitride semiconductor devices use a Si substrate whose cost is low as compared to a sapphire substrate or a SiC substrate. Accordingly, there is a technique for forming, above the Si substrate, a nitride semiconductor layer made of a group III nitride semiconductor. However, when the nitride semiconductor layer made of a group III nitride semiconductor is directly formed on the Si substrate, crystallinity of the group III nitride semiconductor in the nitride semiconductor layer is reduced compared to when the nitride semiconductor layer made of the group III nitride semiconductor is formed above the SiC substrate, due to a large lattice constant difference between Si and the group III nitride semiconductor. In view of the above, a technique has been proposed to form the nitride semiconductor layer made of a group III nitride semiconductor above 3C—SiC after a buffer layer made of 3C—SiC is formed above the Si substrate, to reduce the lattice constant difference between Si and the group III nitride semiconductor The use of the buffer layer made of 3C—SiC enables the nitride semiconductor layer made of the group III nitride semiconductor to be thickly stacked. This makes the crystallinity of the group III nitride semiconductor equivalent to the crystallinity of the group III nitride semiconductor when the nitride semiconductor layer made of the group III nitride semiconductor is formed above the SiC substrate.

As for high-frequency power devices, a technique has been proposed to electrically connect a back electrode and a source electrode on a substrate by forming a grounded back electrode on the back surface of the substrate and burying metal in a through via that penetrates the substrate. This configuration can increase the grounding of the source electrode. Accordingly, a reduction in the gain can be inhibited.

As conventional nitride semiconductor devices of the above-described type, GaN-based semiconductor devices disclosed by Patent Literature (PTL) 1 and PTL 2 will be hereinafter described.

FIG. 10 is a cross sectional view of nitride semiconductor device 1X disclosed by PTL 1.

As illustrated in FIG. 10, nitride semiconductor device 1X disclosed by PTL 1 includes dielectric substrate 107X, SiC layer 102 formed above dielectric substrate 107X, nitride semiconductor layer 103 made of a group III nitride semiconductor which is formed above SiC layer 102, and source electrode 201, drain electrode 202, and gate electrode 203 which are formed on a surface of nitride semiconductor layer 103. Moreover, in drain area 202D in which drain electrode 202 is provided, opening 104 is provided so as to penetrate drain electrode 202, nitride semiconductor layer 103, and SiC layer 102. Metal layer 305 is buried inside the foregoing opening 104. In addition, dielectric layer 101X in dielectric substrate 107X is provided with through via 301, and conductor 303 is buried in this through via 301. Furthermore, back electrode 304 is provided on the back surface of dielectric layer 101X. Note that dielectric substrate 107X includes dielectric layer 101X, back electrode 304, and conductor 303.

In nitride semiconductor device 1X illustrated in FIG. 10, back electrode 304 and drain electrode 202 are electrically connected via conductor 303 buried in through via 301 and metal layer 305 buried in opening 104. Specifically, according to the manufacturing method disclosed by PTL 1, SiC layer 102 and dielectric substrate 107X are joined together such that metal layer 305 and conductor 303 are connected, after a Si substrate on the back surface of SiC layer 102 is removed.

FIG. 11 is a cross sectional view of nitride semiconductor device 1Y disclosed by PTL 2. As illustrated in FIG. 11, nitride semiconductor device 1Y disclosed by PTL 2 includes Si substrate 101 that is an insulation substrate, nitride semiconductor layer 103 made of a group III nitride semiconductor which is formed above Si substrate 101, and source electrode 201, drain electrode 202, and gate electrode 203 which are formed on a surface of nitride semiconductor layer 103. Moreover, in source area 201S in which source electrode 201 is provided, metal layer 305 that serves as a stopper layer is provided. Back electrode 304 is provided on the back surface of Si substrate 101.

In nitride semiconductor device 1Y illustrated in FIG. 11, through via 301 that penetrates Si substrate 101 and nitride semiconductor layer 103 reaches metal layer 305, and back electrode 304 is electrically connected with source electrode 201 via metal layer 305. Note that, according to the manufacturing method disclosed by PTL 2, through via 301 is formed from the back surface side of Si substrate 101, and conductor 303 is filled into through via 301 after back electrode 304 is formed along through via 301.

CITATION LIST

Patent Literature

PTL 1: Japanese Unexamined Patent Application Publication No. 2013-243275
PTL 2: Japanese Unexamined Patent Application Publication No. 2019-033097

SUMMARY

Technical Problem

However, as described above, in nitride semiconductor device 1X illustrated in FIG. 10, SiC layer 102 and dielectric substrate 107X are joined together such that metal layer 305 and conductor 303 are connected, after the Si substrate on the back surface of SiC layer 102 is removed. Since these are complicated manufacturing processes, the cost increases.

Meanwhile, in nitride semiconductor device 1Y illustrated in FIG. 11, through via 301 is formed from the back surface of Si substrate 101 to connect back electrode 304 and source electrode 201. For this reason, manufacturing processes for manufacturing nitride semiconductor device 1Y illustrated in FIG. 11 are not complicated. However, the lack of a SiC layer between Si substrate 101 and nitride semiconductor layer 103 causes a reduction in the crystallinity of a group III nitride semiconductor included in nitride semiconductor layer 103 due to a lattice constant difference between Si and the group III nitride semiconductor.

In view of the above, providing of a SiC layer between Si substrate 101 and nitride semiconductor layer 103 in nitride semiconductor device 1Y illustrated in FIG. 11 may be considered. To be more specific, just like nitride semiconductor device 1Z illustrated in FIG. 12, SiC layer 102 is provided between Si substrate 101 and nitride semiconductor layer 103, through via 301 is provided to penetrate, using metal layer 106 as a stopper, Si substrate 101, SiC layer 102, and nitride semiconductor layer 103, and conductor 303 is buried inside through via 301. With this, back electrode 304 and source electrode 201 can be electrically connected via conductor 303 and metal layer 106. In nitride semiconductor device 1Z illustrated in FIG. 12, metal diffusion prevention film 302 is provided on the internal surface of through via 301 so as to avoid mutual diffusion of metals caused by contact between conductor 303 and Si substrate 101. In other words, metal diffusion prevention film 302 is provided between Si substrate 101 and conductor 303.

However, in the configuration of nitride semiconductor device 1Z illustrated in FIG. 12, notch 400 is created in Si substrate 101 when through via 301 is formed since SiC included in SiC layer 102 is hard and is chemically stable. To be more specific, through via 301 is formed by dry etching Si substrate 101 and SiC layer 102 using a fluorine-based gas or a chlorine-based gas. Since an etch rate at which SiC is etched is slower than an etch rate at which Si is etched, side etching occurs in Si substrate 101 in the vicinity of SiC layer 102. This side etching results in notch 400.

When notch 400 is created in Si substrate 101, notch 400 may serve as a void when conductor 303 is formed inside through via 301. Moreover, the presence of notch 400 may reduce the coverage of metal diffusion prevention film 302, and this leads conductor 303 and Si substrate 101 to become highly resistive due to mutual diffusion of metals caused by contact between conductor 303 and Si substrate 101. Consequently, the quality of nitride semiconductor device 1Z is reduced, and thus yield is reduced.

The present disclosure is presented with consideration given to the above-described problems, and aims to provide a semiconductor device that can be provided with a through via that penetrates a Si substrate and a SiC layer without an occurrence of a notch, even though the SiC layer is provided between the Si substrate and a nitride semiconductor layer.

Solution to Problem

In order to provide the above-described semiconductor device, one aspect of a semiconductor device according to the present disclosure includes: a Si substrate; a back electrode provided below the Si substrate; a SiC layer provided above the Si substrate; a semiconductor layer provided above the SiC layer and made of a group III nitride semiconductor; a source electrode and a drain electrode provided above the semiconductor layer; a gate electrode in contact with the semiconductor layer; an intermediate layer provided in an opening that creates an opening in at least the SiC layer; a metal layer provided above the opening; and a conductor provided inside a through via that penetrates the intermediate layer and the Si substrate, and electrically connected with the back electrode and the metal layer. The metal layer covers the through via. The intermediate layer is provided between the SiC layer and the conductor. The intermediate layer is a metal nitride layer or a silicon oxide layer.

In addition, one aspect of a method for manufacturing a semiconductor device according to the present disclosure includes: forming a SiC layer above a Si substrate; forming a semiconductor layer made of a group III nitride semiconductor above the SiC layer; forming an opening that creates an opening in the SiC layer; forming an intermediate layer in the opening; forming a source electrode, a drain electrode, and a gate electrode above the semiconductor layer; forming a metal layer above the opening to cover at least a portion of the intermediate layer; forming, using the metal layer as a stopper, a through via that penetrates the Si substrate and the intermediate layer from a lower surface side of the Si substrate; forming a conductor inside the through via; and forming a back electrode below the Si substrate. The back electrode and the metal layer are electrically connected via the conductor. The intermediate layer is provided between the SiC layer and the conductor. The intermediate layer is a metal nitride layer or a silicon oxide layer.

Advantageous Effects

According to a semiconductor device according to the present disclosure, a through via that penetrates a Si substrate and a SiC layer can be provided without an occurrence of a notch, even though the SiC layer is provided between the Si substrate and a nitride semiconductor layer.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
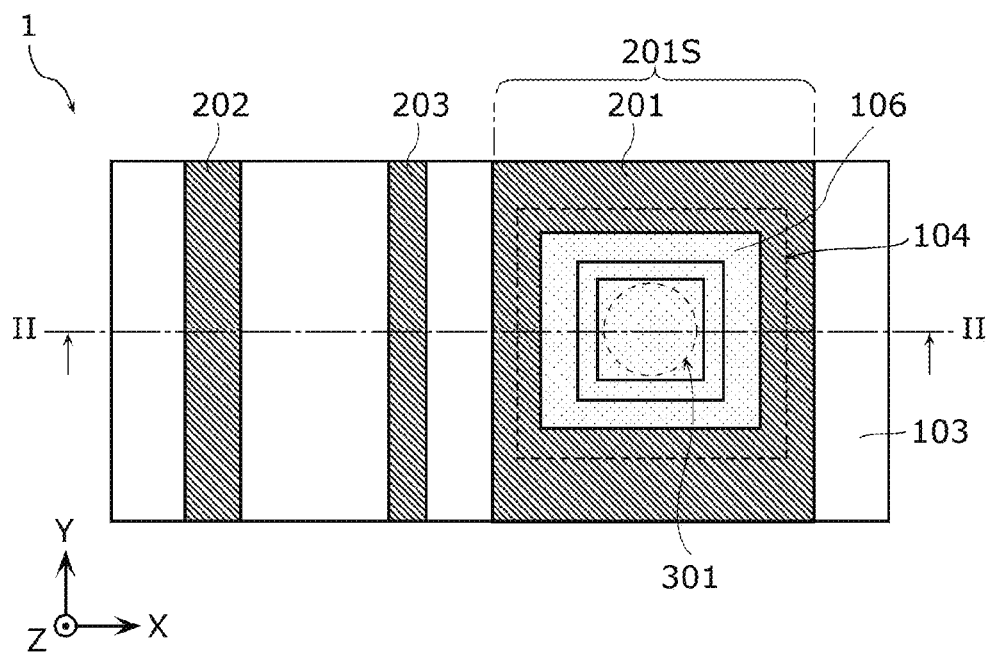
FIG. 1 is a plan view of a semiconductor device according to Embodiment 1.

Hereinafter, embodiments according to the present disclosure will be described with reference to the drawings. Note that the embodiments described below each show a specific example of the present disclosure. Therefore, the numerical values, shapes, materials, elements, the arrangement and connection of the elements, steps (processes), the orders of the steps, and the like described in the following embodiments are mere examples, and thus are not intended to limit the present disclosure. Accordingly, elements among the elements in the following embodiments which are not recited in any one of the independent claims representing the most generic concepts will be described as optional elements.

In addition, the drawings are schematic diagrams, and do not necessarily provide strictly accurate illustration. Throughout the drawings, the same reference numeral is given to substantially the same element, and redundant description is omitted or simplified.

Moreover, in the present specification, terms denoting relationships between elements, such as parallel and perpendicular, and terms denoting shapes of elements, such as quadrilateral, and the range of numerical values are not expressions only representing strict meanings, but also representing meanings in substantially the same range, i.e., such meanings include a difference of about a few percent, for example.

Moreover, in the present specification, terms used for describing the configuration of a semiconductor device, such as "upper/above", "up", "lower/below", and "down", do not refer to the upward (vertically upward) direction and the downward (vertically downward) direction in terms of absolute spatial recognition, but are used as terms defined by relative positional relationships based on the stacking order in a stacked configuration.

In addition, in the present specification and drawings, the X axis, Y axis, and Z axis represent the three axes of a three-dimensional orthogonal coordinate system. Specifically, in the present specification, the X axis and the Y axis are two axes parallel to a principal surface that a substrate included in a semiconductor device includes, and the Z axis direction is orthogonal to the principal surface. To be more specific, the X axis direction is a direction in which a source electrode, a gate electrode, and a drain electrode are aligned in the stated order, i.e., the so-called gate length direction. Moreover, in the present specification, "plan view" indicates a view of the principal surface (upper surface) of the substrate included in a semiconductor device from the Z axis direction, unless otherwise stated.

In addition, in the present specification, a group III nitride semiconductor is a semiconductor that contains one or more types of group III elements and nitrogen. The group III elements includes, for example, aluminum (Al), gallium (Ga), and indium (In). As examples of a group III nitride semiconductor, GaN, AlN, InN, AlGaN, InGaN, and AlInGaN can be presented. A group III nitride semiconductor may contain one or more types of elements other than the group III elements, such as silicon (Si) and phosphorus (P). Note that when a group III nitride semiconductor is indicated as AlInGaN in the following description, the group III nitride semiconductor contains all of Al, In, Ga, and N, unless otherwise stated. The same applies to other indications, such as AlGaN and GaN.

Moreover, a layer made of a group III nitride semiconductor and a layer including the group III nitride semiconductor mean that each of these layers substantially include only the group III nitride semiconductor. Nevertheless, these layers may contain, as impurities, a proportion of at most 1 at. % of other chemical elements, such as elements that cannot be prevented from being mixed from manufacturing viewpoint, for example.

Embodiment 1

Figure 2:
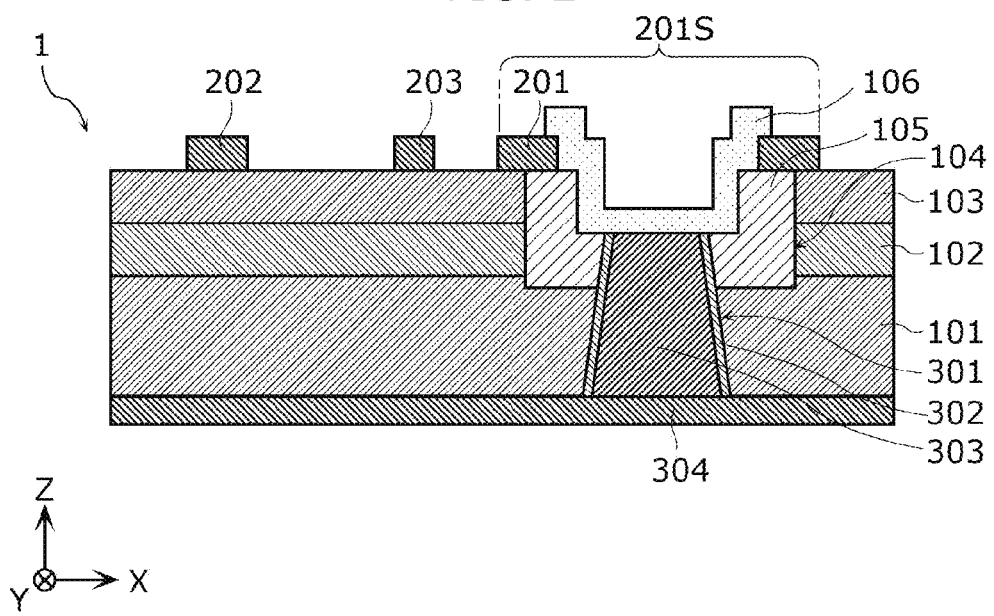
FIG. 2 is a cross sectional view of the semiconductor device according to Embodiment 1, taken along line II-II shown in FIG. 1.

First, semiconductor device 1 according to Embodiment 1 will be described with reference to FIG. 1 and FIG. 2. FIG. 1 is a plan view of semiconductor device 1 according to Embodiment 1. FIG. 2 is a cross sectional view of semiconductor device 1 according to Embodiment 1, taken along line II-II shown in FIG. 1. Note that in FIG. 1, source electrode 201, drain electrode 202, and gate electrode 203 are hatched for convenience in easily identifying the positions of these electrodes.

Semiconductor device 1 is a nitride semiconductor device formed using a group III nitride semiconductor. The present embodiment describes the case where semiconductor device 1 is a high electron mobility transistor (HEMT).

As illustrated in FIG. 1 and FIG. 2, semiconductor device 1 includes silicon substrate (Si substrate) 101, silicon carbide layer (SiC layer) 102, nitride semiconductor layer 103, intermediate layer 105, metal layer 106, source electrode 201, drain electrode 202, gate electrode 203, metal diffusion prevention film 302, conductor 303, and back electrode 304.

Si substrate 101 is a substrate made of Si whose principal surface is a (111) plane, for example. The resistivity of Si substrate 101 is, as one example, at least 1 kΩ and at most 20Ω, but is not limited thereto. In addition, the type of dopant in Si substrate 101 may be the P type or the N type. Moreover, as Si substrate 101, substrates having multiple combinations of resistivity and dopants may be used.

In the present embodiment, Si substrate 101 is a substrate that the substrate itself is made of Si, but is not limited thereto. For example, Si substrate 101 may be a substrate whose substrate type is a sapphire substrate, a GaN substrate, or an AlN substrate and above which silicon is formed.

SiC layer 102 is provided above Si substrate 101. In the present embodiment, SiC layer 102 is provided on a first principal surface (top surface) of Si substrate 101. SiC layer 102 is an epitaxial layer made of, for example, 3C—SiC. In "3C—SiC", the letter "C" stands for a cubic crystal and the number "3" denotes the number of tetrahedral structure layers included within one pattern in the stacked direction. The thickness of SiC layer 102 is, as one example, at least 5 nm and at most 5000 nm, but is not limited thereto. In the present embodiment, the thickness of SiC layer 102 is 2000 nm (2 μm).

Nitride semiconductor layer 103 is provided above SiC layer 102. In the present embodiment, nitride semiconductor layer 103 is directly provided on SiC layer 102. Nitride semiconductor layer 103 is a semiconductor layer made of a group III nitride semiconductor. Specifically, nitride semiconductor layer 103 is a stacked structure of multiple semiconductor layers each of which includes a group III nitride semiconductor. Nitride semiconductor layer 103 includes an active layer made of a group III nitride semiconductor. Moreover, nitride semiconductor layer 103 includes, within the layers, a two dimensions electron gas layer that serves as carriers of a transistor. The two dimensions electron gas is produced at a hetero interface of the active layer. Note that the carriers of the transistor may be formed by ion implantation or doping under conditions of epitaxial layer formation.

The thickness of nitride semiconductor layer 103 is, for example, at least 100 nm and at most 15000 nm, but is not limited thereto. In the present embodiment, the thickness of nitride semiconductor layer 103 is 5000 nm (5 μm).

Above nitride semiconductor layer 103, source electrode 201 and drain electrode 202 are provided. In the present specification, source electrode 201 and drain electrode 202 are provided on the surface of nitride semiconductor layer 103 with a space therebetween. Source electrode 201 and drain electrode 202 face each other in the X axis direction. Source electrode 201 is provided above source area 201S in nitride semiconductor layer 103.

Source electrode 201 and drain electrode 202 are metal layers each including a metal material. To be more specific, source electrode 201 and drain electrode 202 each include a single metal or an alloy containing at least one metal selected from among, for example, Ti, Al, Ni, Au, Ta, W, Pd, and Cu. In the present embodiment, source electrode 201 and drain electrode 202 each are a stacked structure in which a Ti layer and an Al layer are stacked in sequence. Note that source electrode 201 and drain electrode 202 each need not be a stacked structure of metal layers. Source electrode 201 and drain electrode 202 each may be a single metal layer.

Moreover, source electrode 201 and drain electrode 202 are each electrically connected with the two dimensions electron gas layer. Specifically, source electrode 201 and drain electrode 202 are each ohmically connected with the two dimensions electron gas layer.

Gate electrode 203 is provided above nitride semiconductor layer 103. In the present embodiment, gate electrode 203 is provided on the surface of nitride semiconductor layer 103 just like source electrode 201 and drain electrode 202. In other words, gate electrode 203 is in contact with nitride semiconductor layer 103. Moreover, gate electrode 203 is provided between source electrode 201 and drain electrode 202.

Gate electrode 203 includes a single metal or an alloy containing at least one metal selected from among, for example, Ti, TiN, Ta, TaN, W, Ni, Pd, Au, Al, and Cu. In the present embodiment, gate electrode 203 is a stacked structure in which a Ni layer and a Au layer are stacked in sequence. Note that gate electrode 203 need not be a stacked structure of metal layers. Gate electrode 203 may be a single metal layer.

Gate electrode 203 has a function of controlling a current flowing between source electrode 201 and drain electrode 202 (source-to-drain) by a voltage or a current applied to gate electrode 203 for the carriers generated inside nitride semiconductor layer 103. Gate electrode 203 may be configured to make semiconductor device 1 a Schottky junction-type semiconductor device. Moreover, semiconductor device 1 may be configured such that semiconductor device 1 has the so-called metal-insulator-semiconductor (MIS) structure in which an insulating layer is provided between gate electrode 203 and nitride semiconductor layer 103 and has a normally-on structure. Note that semiconductor device 1 may have a normally-off structure in which a P-type nitride semiconductor layer is provided between gate electrode 203 and nitride semiconductor layer 103.

Opening 104 is provided in SiC layer 102. Opening 104 creates an opening in at least SiC layer 102. In the present embodiment, opening 104 creates an opening in SiC layer 102 and nitride semiconductor layer 103. In other words, opening 104 penetrates SiC layer 102 and nitride semiconductor layer 103, and causes a portion of a surface of Si substrate 101 to be exposed.

Opening 104 is provided in a portion of source area 201S in which source electrode 201 is formed. A distance between opening 104 and an end portion of source electrode 201 on the gate electrode 203 side is, for example, at least 500 nm. This inhibits a reduction in crystallinity of nitride semiconductor layer 103 between gate electrode 203 and source electrode 201.

In the present embodiment, opening 104 is provided in a portion of source area 201S, but is not limited thereto. For example, opening 104 may be provided in an area in which drain electrode 202 or gate electrode 203 is formed, or may be provided in an area other than an active area in which the transistor is formed.

Note that although a side surface of SiC layer 102 is flush with a side surface of nitride semiconductor layer 103 within opening 104, the side surface of SiC layer 102 and the side surface of nitride semiconductor layer 103 are not limited thereto. For example, within opening 104, the side surface of nitride semiconductor layer 103 may be recessed, relative to the side surface of SiC layer 102, toward a side opposite the opening 104 side or may be protruded, relative to the side surface of SiC layer 102, toward the inside of opening 104. Moreover, the opening width of opening 104 may be invariant in the Z axis direction or may be variant in the Z axis direction. In this case, the opening width of opening 104 may be continuously reduced or discontinuously reduced from the upper surface of opening 104 toward the lower surface of opening 104.

Intermediate layer 105 is provided in opening 104. Intermediate layer 105 is provided between an upper surface portion of Si substrate 101 exposed by opening 104 and metal layer 106. Specifically, intermediate layer 105 is provided between the upper surface of Si substrate 101 and the lower surface of metal layer 106 within opening 104 and between a side surface of SiC layer 102 (the internal surface of opening 104) and a side surface of conductor 303. In the present embodiment, intermediate layer 105 is also provided between a side surface of nitride semiconductor layer 103 and metal layer 106 within opening 104. Moreover, although the upper surface of intermediate layer 105 is substantially flush with the upper surface of nitride semiconductor layer 103, the upper surface of intermediate layer 105 and the upper surface of nitride semiconductor layer 103 are not limited thereto.

In the top view, intermediate layer 105 (opening 104) is provided so as to surround through via 301. In other words, intermediate layer 105 (opening 104) is provided so as to surround conductor 303 buried in through via 301 and metal diffusion prevention film 302. Accordingly, intermediate layer 105 (opening 104) is provided between conductor 303 (through via 301) and SiC layer 102. In other words, intermediate layer 105 is an interposition layer that is interposed between conductor 303 and SiC layer 102.

Intermediate layer 105 is a metal nitride layer or a silicon oxide layer. Intermediate layer 105 functions as a buffer layer that alleviates a defect caused by etch rate differences between SiC and Si when through via 301 that penetrates Si substrate 101 and SiC layer 102 is formed by etching. For example, when Si substrate 101 and SiC layer 102 are etched by dry etching using a fluorine-containing gas or a chlorine-containing gas, the etch rate for the fluorine-containing gas is expressed by Si>SiO$_2$>SiC>GaN, and the etch rate for the chlorine-containing gas is expressed by Si=GaN>SiC. For this reason, as a material to be included in intermediate layer 105, a material having an etch rate faster than the etch rate of SiC may be used. To be more specific, as a material to be included in intermediate layer 105, a material having an etch rate faster than the etch rate of SiC and slower than the etch rate of Si may be used.

As one example, a material to be included in intermediate layer 105 is a metal nitride, such as GaN, AlN, TiN, TaN, WN, InN, and SiN, or a silicon nitride, such as SiO$_2$ and BPSG (SiO$_2$ containing boron (B) and phosphorus (P)). Intermediate layer 105 includes a single layer containing any one material selected from among the above materials or multiple layers containing materials selected from among the above materials. In the present embodiment, intermediate layer 105 is a silicon nitride layer (SiN layer).

Although depended on etching conditions, it should be noted that relationships of the etch rate between different one of GaN, AlN, TiN, SiN, and SiO$_2$ and Si can be expressed by GaN=Si, AlN=Si, TiN>Si, SiN>Si, and SiO$_2$>Si (equal signs and inequality signs denote relationships of the magnitude of the etch rate). Moreover, the Vickers hardness of each of these materials is as follows: GaN has 15 GPa, AlN has 9.8 GPa to 10.4 GPa, TiN has 10.8 GPa, SiN has 14 GPa, and SiO$_2$ has 9.7 GPa. Note that Si has the Vickers hardness of 9.8 GPa to 10.6 GPa, and SiC has the Vickers hardness of 23 GPa. Accordingly, the Vickers hardness of intermediate layer 105 is, for example, at least 9.8 GPa that is the Vickers hardness of Si substrate 101 and is the minimum hardness, and is, for example, less than 23 GPa that is the Vickers hardness of SiC layer 102.

In the present embodiment, intermediate layer 105 is in contact with both Si substrate 101 and metal layer 106, but intermediate layer 105 is not limited thereto. In other words, intermediate layer 105 need not be in contact with Si substrate 101, and intermediate layer 105 need not be in contact with metal layer 106. For example, a layer made of a material other than a metal nitride and a silicon oxide may be interposed between Si substrate 101 and intermediate layer 105. Specifically, a layer made of a material whose etch rate is equivalent to the etch rate of Si substrate 101 or a material whose etch rate is between the etch rate of Si substrate 101 and the etch rate of intermediate layer 105 may be interposed between Si substrate 101 and intermediate layer 105. In addition, a layer made of a material whose etch rate is equivalent to the etch rate of intermediate layer 105 or a material whose etch rate is between the etch rate of intermediate layer 105 and the etch rate of metal layer 106 may be interposed between intermediate layer 105 and metal layer 106.

The thickness of intermediate layer 105 is, for example, at least 100 nm and at most 15000 nm. However, the thickness of intermediate layer 105 is not limited thereto. In the present embodiment, the thickness of intermediate layer 105 is 500 nm.

Metal layer 106 is provided above opening 104. In addition, metal layer 106 covers at least a portion of intermediate layer 105. In the present embodiment, metal layer 106 is provided so as to cover not only intermediate layer 105, but also a portion of source electrode 201. Moreover, metal layer 106 located above opening 104 also covers conductor 303. Specifically, metal layer 106 covers the upper surface of conductor 303, the bottom surface and a side surface of intermediate layer 105, and a portion of source electrode 201. Metal layer 106 that covers conductor 303 also covers through via 301. In the present embodiment, metal layer 106 covers the entirety of through via 301. To be more specific, metal layer 106 is provided so as to protrude from an opening of through via 301.

Metal layer 106 functions as an etching stopper layer to stop etching of through via 301 provided in Si substrate 101. Metal layer 106 includes a single metal or an alloy containing at least one metal selected from among, for example, Cu, Au, Pt, Ni, and Mo. Metal layer 106 may also include a single metal or an alloy made of metals having high melting points, such as W, Ti, and Ta. With this, formation of a mixed crystal by metal layer 106 and conductor 303 being mixed together can be inhibited. Metal layer 106 may also include a metal nitride including W, Ti, or Ta. In the present embodiment, metal layer 106 is a titanium nitride layer (TiN layer) having a thickness of 300 nm. Note that metal layer 106 may be either a single layer or multiple layers.

Metal layer 106 is electrically connected to source electrode 201. Metal layer 106 and source electrode 201 may be electrically connected with each other by being in direct contact with each other or via an electric conductor, such as a wiring layer (not illustrated). Note that metal layer 106 may be electrically connected with drain electrode 202 or gate electrode 203, not with source electrode 201.

Semiconductor device 1 is provided with through via 301 that penetrates intermediate layer 105 and Si substrate 101. In the present embodiment, through via 301 is provided in source area 201S. In plan view, through via 301 is located inside opening 104. Through via 301 is a through hole, and penetrates intermediate layer 105 and Si substrate 101 such that metal layer 106 is exposed. Consequently, the upper surface of through via 301 is the lower surface of metal layer 106. In this case, the width of the lowermost surface of metal layer 106 is greater than the opening width in the uppermost surface of through via 301.

Moreover, in plan view, through via 301 is surrounded by intermediate layer 105. In the present embodiment, an opening of through via 301 is circular in shape. In the present embodiment, the inside diameter (opening width) of through via 301 monotonically decreases from the lower surface of through via 301 toward the upper surface of through via 301. In other words, the area size of the opening of through via 301 is continuously decreased from the lower surface of through via 301 toward the upper surface of through via 301. Since this causes the side surface of through via 301 to be forward tapered in shape from the lower surface of through via 301 toward the upper surface of through via 301, occurrences of a void and a crack in metal diffusion prevention film 302 and occurrences of failures in forming conductor 303 can be prevented when metal diffusion prevention film 302 and conductor 303 are formed from the back surface of Si substrate 101. In other words, a highly reliable through via 301 can be formed in semiconductor device 1. Note that the inside diameter of through via 301 may be discontinuously decreased from the lower surface of through via 301 toward the upper surface of through via 301. Moreover, in the present embodiment, the side surface of through via 301 in Si substrate 101 is flush with the side surface of through via 301 in intermediate layer 105, but the side surface in Si substrate 101 and the side surface in intermediate layer 105 may be discontinuous.

Metal diffusion prevention film 302 is provided so as to cover the side surface of through via 301. Metal diffusion prevention film 302 is a thin layer provided to avoid interdiffusion of metals caused by Si substrate 101 and conductor 303 coming into contact with each other. Metal diffusion prevention film 302 may be an insulating film including an insulating material, but may be a conductive film including a conductive material. Metal diffusion prevention film 302 includes a single layer containing any one material selected from among Ti, Ta, TiN, TaN, WN, SiO$_2$, and SiN or multiple layers containing materials selected from among Ti, Ta, TiN, TaN, WN, SiO$_2$, and SiN. In the present embodiment, metal diffusion prevention film 302 is a stacked structure in which a Ti layer and a TiN layer are stacked in sequence. When metal diffusion prevention film 302 includes a conductive material, it should be noted that not only the side surface of through via 301 may be covered, but also the upper surface of through via 301 may be covered.

Inside through via 301, conductor 303 made of a conductive material is provided. To be more specific, conductor 303 is provided inside through via 301 whose internal surface is covered by metal diffusion prevention film 302. Conductor 303 is a buried via formed such that through via 301 is filled with conductor 303.

In the present embodiment, conductor 303 is a metal layer that includes a metal material. Conductor 303 includes a single layer containing any one material selected from among Ti, Ta, Cu, Al, Au, Ni, and W or multiple layers containing materials selected from among Ti, Ta, Cu, Al, Au, Ni, and W. In the present embodiment, conductor 303 is a stacked structure in which a Ti layer and a Cu layer are stacked in sequence or a stacked structure in which a Ti layer, a TiN layer, a Ti layer, and a Cu layer are stacked in sequence. Note that conductor 303 may be filled into through via 301 such that the inside of through via 301 is completely packed with conductor 303, or conductor 303 may be filled into through via 301 so as to leave a hollow inside through via 301.

Conductor 303 is electrically connected with back electrode 304 and metal layer 106. Back electrode 304 and metal layer 106 are electrically connected via conductor 303. In the present embodiment, metal layer 106 and source electrode 201 are electrically connected. Accordingly, source electrode 201 and back electrode 304 are electrically connected via metal layer 106 and conductor 303.

Back electrode 304 is provided below Si substrate 101. In the present embodiment, back electrode 304 is provided on a second principal surface (back surface) of Si substrate 101 that faces away from the first principal surface (top surface) of Si substrate 101.

Back electrode 304 is a solid electrode (an electrode planar in shape (i.e., solid) which is substantially uniformly continuous without a gap) that covers the back surface of Si substrate 101. In the present embodiment, back electrode 304 covers the entire back surface of Si substrate 101.

Back electrode 304 includes a single metal or an alloy containing at least one metal selected from among, for example, Ti, Al, W, Ta, Cu, Ni, Au, Sn, and Ag. Moreover, back electrode 304 may be a single-layer structure or may be a stacked structure in which a plurality of metal layers are stacked. In the present embodiment, back electrode 304 is a stacked structure in which a Ti layer, a Ni layer, and a Au layer are stacked in sequence. Note that back electrode 304 and conductor 303 may include the same materials.

Back electrode 304 is electrically grounded. In other words, the electric potential of back electrode 304 is the ground potential. As described above, back electrode 304 is electrically connected with source electrode 201 via conductor 303 and metal layer 106. In other words, back electrode 304 and source electrode 201 have the same electric potential. Note that back electrode 304 need not be electrically connected with source electrode 201, and may be electrically connected with drain electrode 202 or gate electrode 203.

Next, a method for manufacturing semiconductor device 1 according to Embodiment 1 will be described with reference to FIG. 3A through FIG. 3H. FIG. 3A through FIG. 3H are diagrams illustrating processes of the method for manufacturing semiconductor device 1 according to Embodiment 1.

Figure 3A:
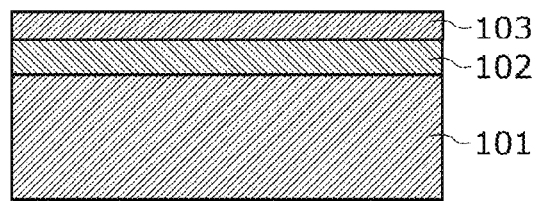
FIG. 3A is a diagram illustrating a process of forming a SiC layer and a nitride semiconductor layer above a Si substrate in a method for manufacturing the semiconductor device according to Embodiment 1.

First, as illustrated in FIG. 3A, SiC layer 102 is formed above Si substrate 101. Specifically, SiC layer 102 is formed by causing 3C—SiC that is a (111) plane having a thickness of 2 μm to epitaxially grow on the surface of Si substrate 101. Thereafter, nitride semiconductor layer 103 made of group III nitride semiconductors is formed above SiC layer 102. Specifically, nitride semiconductor layer 103 having a thickness of 5 μm is formed on the surface of SiC layer 102 by causing a stacked structure of a plurality of semiconductor layers made of group III nitride semiconductors to epitaxially grow. Note that nitride semiconductor layer 103 includes, within the layers, a two dimensions electron gas layer that serves as carriers of a transistor.

Figure 3B:
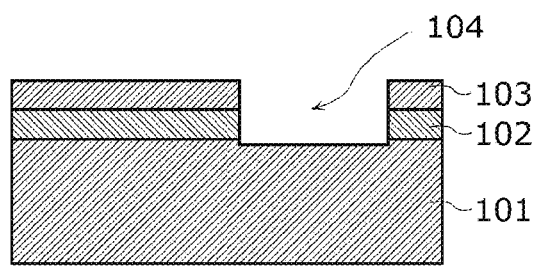
FIG. 3B is a diagram illustrating a process of forming an opening in the SiC layer and the nitride semiconductor layer in the method for manufacturing the semiconductor device according to Embodiment 1.

Next, as illustrated in FIG. 3B, opening 104 that creates an opening in SiC layer 102 is formed. In the present embodiment, opening 104 creates an opening in SiC layer 102 and nitride semiconductor layer 103. Specifically, a resist mask is formed, in the first place, in an area other than an area in which opening 104 is formed by patterning a resist (not illustrated) using a photolithography method and etching after the resist is applied on the surface of nitride semiconductor layer 103. Thereafter, using a dry etching method that uses the resist mask as a mask, nitride semiconductor layer 103 and SiC layer 102 are removed by etching to form opening 104 that penetrates nitride semiconductor layer 103 and SiC layer 102 and to cause Si substrate 101 to be exposed. Thereafter, a polymer adhered due to dry etching and the resist mask are removed.

Figure 3C:
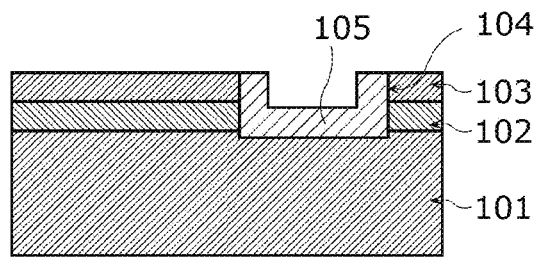
FIG. 3C is a diagram illustrating a process of forming an intermediate layer in the opening in the method for manufacturing the semiconductor device according to Embodiment 1.

Next, as illustrated in FIG. 3C, intermediate layer 105 is formed in opening 104. Specifically, after a silicon nitride layer having a thickness of 500 nm is deposited above nitride semiconductor layer 103 using a chemical vapor deposition (CVD) method so as to cover opening 104, the silicon nitride layer, other than the silicon nitride layer in opening 104, is removed using a photolithography method and dry etching to leave only the silicon nitride layer inside opening 104. Wit this, intermediate layer 105 made of the silicon nitride layer is formed so as to cover the internal surface of opening 104.

Figure 3D:
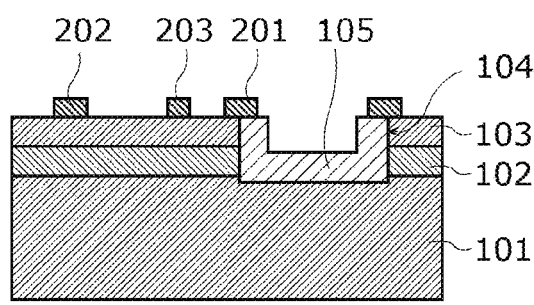
FIG. 3D is a diagram illustrating a process of forming a source electrode, a drain electrode, and a gate electrode in the method for manufacturing the semiconductor device according to Embodiment 1.

Next, as illustrated in FIG. 3D, source electrode 201, drain electrode 202, and gate electrode 203 are formed above nitride semiconductor layer 103. Specifically, a Ti layer and an Al layer each of which has been patterned by a photoresist are sequentially stacked on the surface of nitride semiconductor layer 103 using an evaporation method. Then, after the Ti layer and the Al layer are patterned by a lift-off process, an alloying process takes place by heat treatment to form source electrode 201 and drain electrode 202 which are ohmically connected with a two dimensions electron gas inside nitride semiconductor layer 103. In this case, source electrode 201 is not formed in an area in which through via 301 is formed in source electrode 201 and the vicinity of the area.

Thereafter, a Ni layer and a Au layer each of which has been patterned by a photoresist are sequentially stacked using an evaporation method. Then, after the Ni layer and the Au layer are patterned by the lift-off process, gate electrode 203 that is in Schottky junction with the two dimensions electron gas inside nitride semiconductor layer 103 is formed. In the present embodiment, gate electrode 203 is formed between source electrode 201 and drain electrode 202.

Figure 3E:
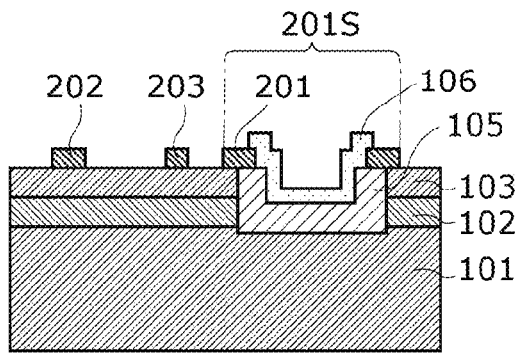
FIG. 3E is a diagram illustrating a process of forming a metal layer above the intermediate layer in the method for manufacturing the semiconductor device according to Embodiment 1.

Next, as illustrated in FIG. 3E, metal layer 106 is formed above opening 104 so as to cover intermediate layer 105. Specifically, after a TiN layer having a thickness of 200 nm is deposited using a sputtering method, the TiN layer other than the TiN layer in source area 201S and a portion of the TiN layer on source electrode 201 are removed using a lithography method and a dry etching method to form metal layer 106 that covers intermediate layer 105 and the remaining portion on source electrode 201.

Figure 3F:
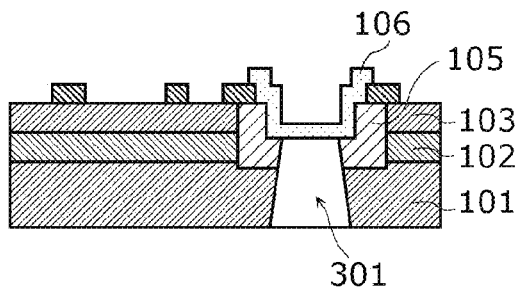
FIG. 3F is a diagram illustrating a process of forming a through via that penetrates the Si substrate and the intermediate layer in the method for manufacturing the semiconductor device according to Embodiment 1.

Next, as illustrated in FIG. 3F, through via 301 that penetrates Si substrate 101 and intermediate layer 105 is formed from the lower surface side (back surface side) of Si substrate 101, using metal layer 106 as a stopper. Specifically, through via 301 is formed on the lower surface side of Si substrate 101 by removing Si substrate 101 and intermediate layer 105 so as to penetrate Si substrate 101 and intermediate layer 105 using a photolithography method and an etching method. As an etching method, dry etching using a fluorine-containing gas or a chlorine-containing gas can be used.

In this case, since intermediate layer 105 is present between SiC layer 102 that is a hard material difficult to be etched and through via 301 in the present embodiment, SiC layer 102 and through via 301 do not overlap. In other words, since intermediate layer 105 is provided so as to surround the circumference of through via 301, when through via 301 is formed by dry etching, SiC layer 102 is not etched, and only Si substrate 101 and intermediate layer 105 are etched. For this reason, an occurrence of a notch in Si substrate 101 can be inhibited when through via 301 is formed. With this, through via 301 that penetrates Si substrate 101 and SiC layer 102 can be readily formed.

Note that the Bosch process or a non-Bosch process may be used to form through via 301. Moreover, through via 301 may be formed under multiple etching conditions, or intermediate layer 105 may be selectively etched with respect to Si substrate 101. In this case, Si substrate 101 is selectively etched using a fluorine-containing gas, and when intermediate layer 105 is a metal nitride layer, intermediate layer 105 can be selectively etched using a chlorine-containing gas. In this case, etching conditions may be switched at some point in Si substrate 101. Note that the roughness of the side surface of through via 301 is, for example, at most 300 nm.

Figure 3G:
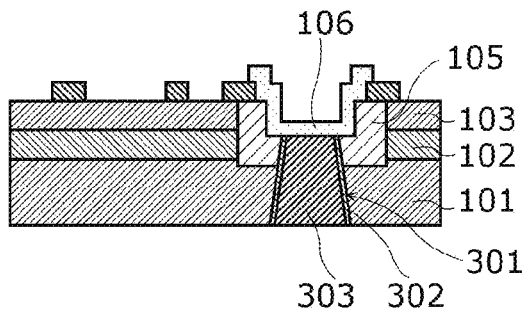
FIG. 3G is a diagram illustrating a process of forming a conductor in the through via in the method for manufacturing the semiconductor device according to Embodiment 1.

Next, as illustrated in FIG. 3G, conductor 303 is formed inside through via 301. In the present embodiment, after a Ti layer, a TiN layer, a Ti layer, and a Cu layer are deposited in sequence using a sputtering method, the inside of through via 301 is filled with a Cu layer using a plating method. Thereafter, the Ti layer, the TiN layer, the Ti layer, and the Cu layer deposited on the back surface of Si substrate 101 are removed by chemical mechanical polishing (CMP). With this, conductor 303 made of the Ti layer, the TiN layer, the Ti layer, and the Cu layer can be formed only inside through via 301.

Figure 3H:
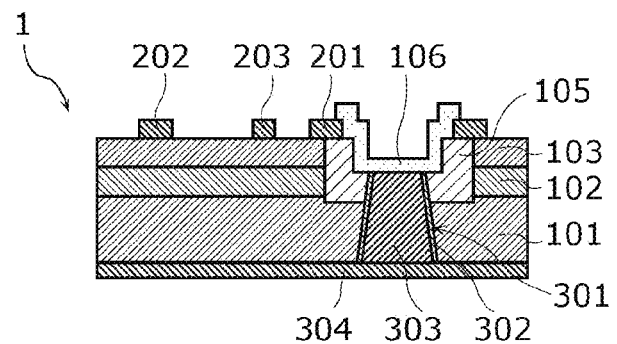
FIG. 3H is a diagram illustrating a process of forming a back electrode on the Si substrate in the method for manufacturing the semiconductor device according to Embodiment 1.

Next, as illustrated in FIG. 3H, back electrode 304 is formed below Si substrate 101. Specifically, a Ti layer, a Ni layer, and a Au layer are sequentially deposited on the back surface of Si substrate 101 using an evaporation method to form back electrode 304 that is a stacked structure of the Ti layer, the Ni layer, and the Au layer on the back surface of Si substrate 101. With this, back electrode 304 and metal layer 106 are electrically connected via conductor 303.

Through the above-described series of processes, semiconductor device 1 having the configuration shown in FIG. 1 and FIG. 2 can be achieved.

As has been described above, semiconductor device 1 according to the present embodiment includes intermediate layer 105 that is a metal nitride layer or a silicon oxide layer provided in opening 104 that creates an opening in SiC layer 102.

Figure 12:
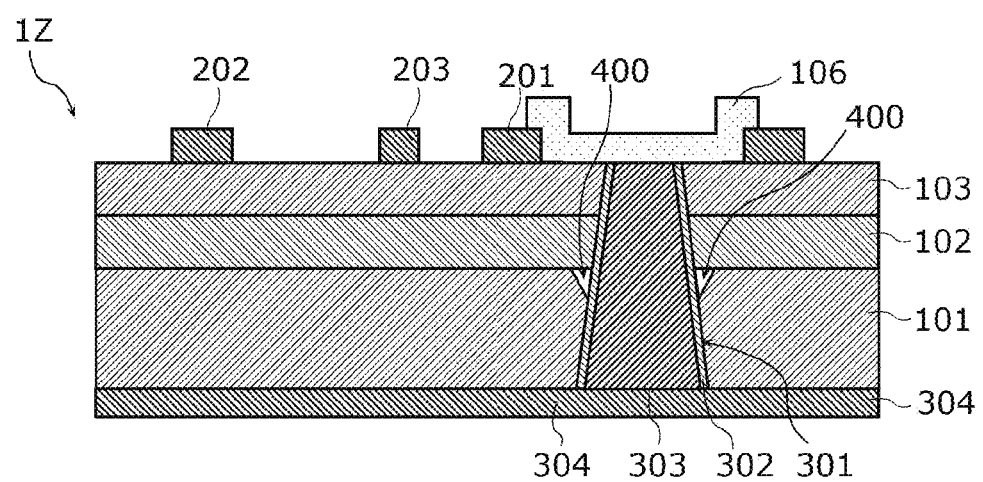
FIG. 12 is a cross sectional view of a nitride semiconductor device presented as a comparative example.

With this configuration, even though through via 301 is to be formed, by etching, in a HEMT structure that is provided with SiC layer 102 including a hard material difficult to be etched between Si substrate 101 and nitride semiconductor layer 103, through via 301 can be formed without simultaneously etching Si substrate 101 and SiC layer 102. To be more specific, intermediate layer 105 whose etch rate is faster than the etch rate of SiC layer 102 (i.e., harder than SiC layer 102) is buried in SiC layer 102 in advance, and this intermediate layer 105 and Si substrate 101 are simultaneously etched to form through via 301. With this, it is possible to inhibit an occurrence of side etching in Si substrate 101 caused by etch rate differences between SiC and Si just like in the above-described nitride semiconductor device 1Z shown in FIG. 12. In other words, an occurrence of a notch can be inhibited.

As has been described above, according to semiconductor device 1 according to the present embodiment, through via 301 that penetrates Si substrate 101 and SiC layer 102 can be readily provided without an occurrence of a notch. Therefore, it is possible to inhibit (i) a notch causing an occurrence of a void in conductor 303 inside through via 301 and (ii) the presence of a notch reducing the coverage of metal diffusion prevention film 302 which leads conductor 303 and Si substrate 101 to become highly resistive due to mutual diffusion of metals caused by contact between conductor 303 and Si substrate 101. As a result, highly reliable semiconductor device 1 can be obtained.

Note that in semiconductor device 1 according to the present embodiment, source electrode 201 is electrically connected to the grounded back electrode 304 via metal layer 106 present in source area 201S and conductor 303. This further increases the grounding of source electrode 201.

Moreover, in semiconductor device 1 according to the present embodiment, the Vickers hardness of intermediate layer 105 is, for example, at least 9.8 GPa that is the Vickers hardness of Si substrate 101 and is, for example, less than 23 GPa that is the Vickers hardness of SiC layer 102.

As described above, setting the hardness of intermediate layer 105 to hardness between the hardness of Si substrate 101 and the hardness of SiC layer 102 effectively inhibits an occurrence of side etching in Si substrate 101 caused by etch rate differences between SiC and Si, even in a structure in which SiC layer 102 is provided between Si substrate 101 and nitride semiconductor layer 103. Accordingly, through via 301 can be readily formed. It should be noted that when a hard layer is provided above Si substrate 101 regardless of a substrate type of the substrate in Si substrate 101, setting the Vickers hardness of intermediate layer 105 to Vickers hardness between the Vickers hardness of the substrate and the Vickers hardness of the hard layer enables through via 301 to be readily formed.

In addition, in semiconductor device 1 according to the present embodiment, the inside diameter of through via 301 monotonically decreases from the lower surface of through via 301 toward the upper surface of through via 301.

With this configuration, the side surface of through via 301 is forward tapered in shape from the lower surface of through via 301 toward the upper surface of through via 301. Accordingly, highly reliable through via 301 can be formed.

Moreover, in semiconductor device 1 according to the present embodiment, the upper surface of intermediate layer 105 is substantially flush with the upper surface of nitride semiconductor layer 103.

With this configuration, surface unevenness at a wafer level called a global step height can be reduced.

In addition, in semiconductor device 1 according to present embodiment, metal layer 106 contains at least one metal selected from among Cu, Au, Pt, Ni, and Mo. Alternatively, metal layer 106 may contain at least one metal selected from among metals having high melting points which are W, Ti, and Ta.

With this configuration, formation of a mixed crystal by metal layer 106 and conductor 303 being mixed together can be inhibited.

Moreover, in semiconductor device 1 according to present embodiment, metal layer 106 and source electrode 201 are electrically connected.

With this configuration, conductor 303 inside through via 301 and source electrode 201 are electrically connected via metal layer 106. In other words, a source via can be implemented.

In addition, in semiconductor device 1 according to the present embodiment, source electrode 201 is provided above source area 201S in nitride semiconductor layer 103, and through via 301 is provided in source area 201S.

With this configuration, the grounding of source electrode 201 can be increased.

Moreover, in semiconductor device 1 according to the present embodiment, the width of the lowermost surface of metal layer 106 is greater than the opening width in the uppermost surface of through via 301.

With this configuration, when through via 301 is formed by etching, it is possible to inhibit etching of an unnecessary portion of through via 301 due to protrusion of through via 301 from metal layer 106. In other words, deviation of through via 301 relative to metal layer 106 can be inhibited.

Variation of Embodiment 1

Figure 4:
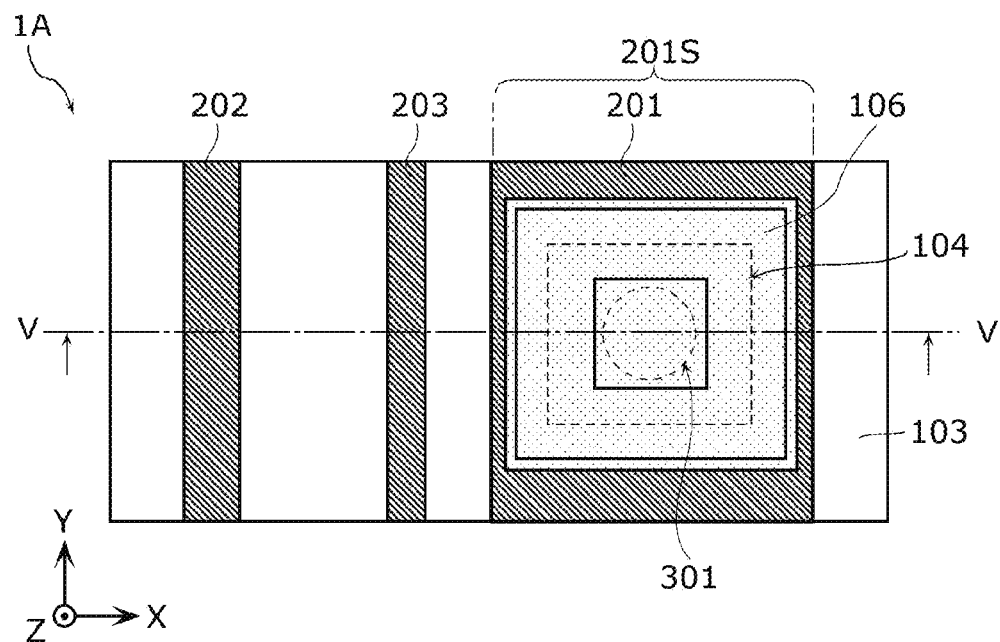
FIG. 4 is a plan view of a semiconductor device according to a variation of Embodiment 1.
Figure 5:
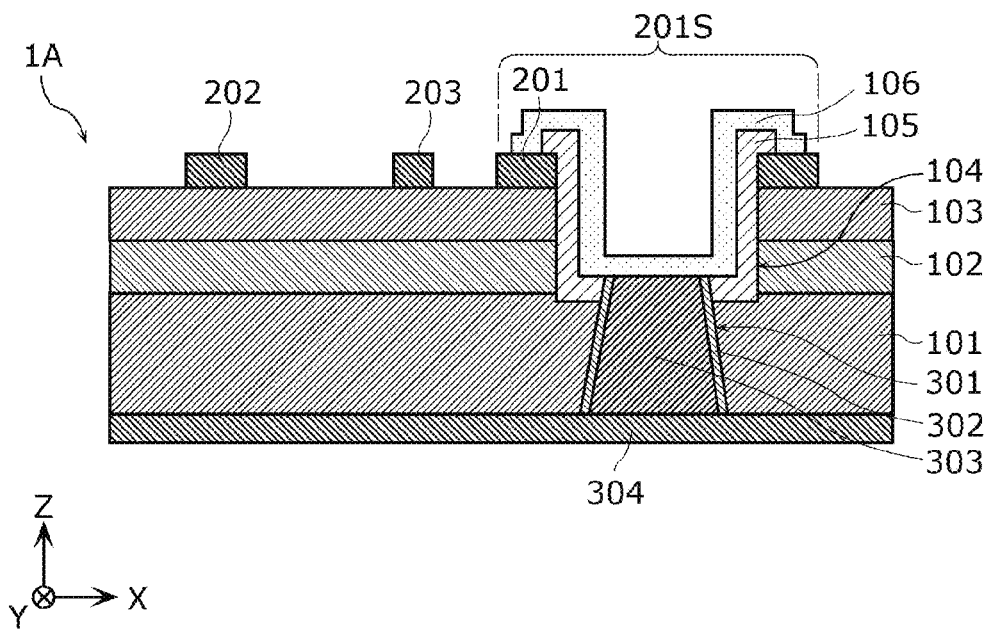
FIG. 5 is a cross sectional view of the semiconductor device according to the variation of Embodiment 1, taken along line V-V shown in FIG. 4.

Next, a variation of Embodiment 1 will be described. First, a configuration of semiconductor device 1A according to the variation of Embodiment 1 will be described with reference to FIG. 4 and FIG. 5. FIG. 4 is a plan view of semiconductor device 1A according to the variation of Embodiment 1. FIG. 5 is a cross sectional view of semiconductor device 1A according to the variation of Embodiment 1, taken along line V-V shown in FIG. 4. Note that in FIG. 4, source electrode 201, drain electrode 202, and gate electrode 203 are hatched for convenience in easily identifying the positions of these electrodes, in the same manner as FIG. 1.

Semiconductor device 1A according to the present variation and semiconductor device 1 according to the above-described Embodiment 1 have differences in the configurations of opening 104 and intermediate layer 105.

Specifically, in the above-described Embodiment 1, opening 104 is provided to create an opening in SiC layer 102 and nitride semiconductor layer 103, but in the present variation, opening 104 creates an opening not only in SiC layer 102 and nitride semiconductor layer 103, but also in source electrode 201. Accordingly, in the present variation, a side surface of SiC layer 102, a side surface of nitride semiconductor layer 103, and a side surface of source electrode 201 are flush with one another. In the present variation, it should be noted that opening 104 is also provided so as to cause Si substrate 101 to be exposed.

In addition, in the above-described Embodiment 1, intermediate layer 105 is provided so as to cover only opening 104 out of opening 104 and source electrode 201, but in the present variation, intermediate layer 105 is provided so as to cover both of opening 104 and source electrode 201. To be more specific, intermediate layer 105 according to the present variation is provided so as to cover the bottom surface and side surfaces of opening 104 and a portion of source electrode 201.

In the present variation, it should be noted that metal layer 106 located above opening 104 also covers conductor 303, intermediate layer 105, and a portion of source electrode 201. In this case, metal layer 106 also covers the upper portion of intermediate layer 105 that covers the upper portion of source electrode 201.

Next, a method for manufacturing semiconductor device 1A according to the variation of Embodiment 1 will be described with reference to FIG. 6A through FIG. 6H. FIG. 6A through FIG. 6H are diagrams illustrating processes of the method for manufacturing semiconductor device 1A according to the variation of Embodiment 1.

Figure 6A:
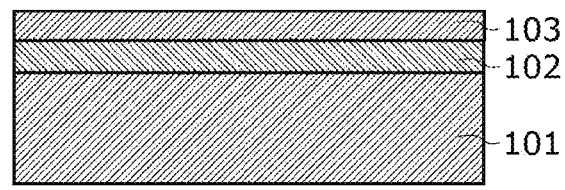
FIG. 6A is a diagram illustrating a process of forming a SiC layer and a nitride semiconductor layer above a Si substrate in a method for manufacturing the semiconductor device according to the variation of Embodiment 1.

First, as illustrated in FIG. 6A, SiC layer 102 is formed above Si substrate 101, and nitride semiconductor layer 103 is formed above SiC layer 102. This process is the same as the process shown in FIG. 3A according to the above-described Embodiment 1.

Figure 6B:
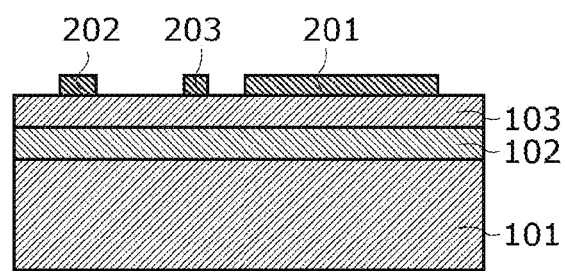
FIG. 6B is a diagram illustrating a process of forming a source electrode, a drain electrode, and a gate electrode in the method for manufacturing the semiconductor device according to the variation of Embodiment 1.

Next, as illustrated in FIG. 6B, source electrode 201, drain electrode 202, and gate electrode 203 are formed above nitride semiconductor layer 103. Specifically, a Ti layer and an Al layer each of which has been patterned by a photoresist are sequentially stacked on the surface of nitride semiconductor layer 103 using an evaporation method in the first place. Then, after the Ti layer and the Al layer are patterned by a lift-off process, an alloying process takes place by heat treatment to form source electrode 201 and drain electrode 202 which are ohmically connected with a two dimensions electron gas inside nitride semiconductor layer 103.

Thereafter, a Ni layer and a Au layer each of which has been patterned by a photoresist are sequentially stacked using an evaporation method. Then, after the Ni layer and the Au layer are patterned by the lift-off process, gate electrode 203 that is in Schottky junction with the two dimensions electron gas inside nitride semiconductor layer 103 is formed. In the present variation, gate electrode 203 is also formed between source electrode 201 and drain electrode 202.

Figure 6C:
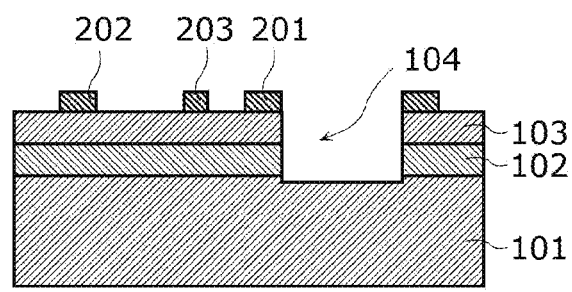
FIG. 6C is a diagram illustrating a process of forming an opening in the method for manufacturing the semiconductor device according to the variation of Embodiment 1.

Next, as illustrated in FIG. 6C, opening 104 that creates an opening in SiC layer 102 and nitride semiconductor layer 103 is formed. In the present embodiment, opening 104 creates an opening in source electrode 201 to create an opening in SiC layer 102 and nitride semiconductor layer 103. Specifically, using a lithography method and an etching method, source electrode 201, nitride semiconductor layer 103, and SiC layer 102 are removed by etching to form opening 104 that penetrates SiC layer 102, nitride semiconductor layer 103, and source electrode 201 and to cause Si substrate 101 to be exposed.

As described above, in the present variation, source electrode 201, nitride semiconductor layer 103, and SiC layer 102 are concurrently removed. Consequently, the width of opening 104 is readily increased compared to the case where these layers are removed in different processes. The width of the lowermost surface of metal layer 106 can therefore be readily increased. This results in an increase in a margin for deviation of through via 301 relative to metal layer 106.

Figure 6D:
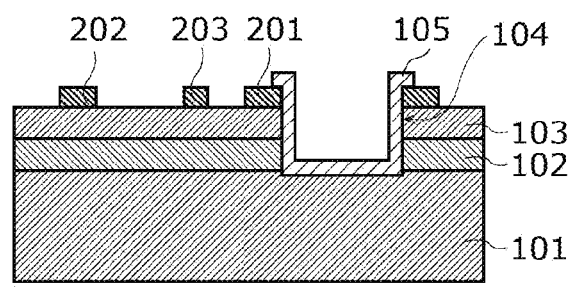
FIG. 6D is a diagram illustrating a process of forming an intermediate layer in the opening in the method for manufacturing the semiconductor device according to the variation of Embodiment 1.

Next, as illustrated in FIG. 6D, intermediate layer 105 is formed in opening 104. Specifically, after a silicon nitride layer having a thickness of 500 nm is deposited above nitride semiconductor layer 103 using a CVD method so as to cover opening 104, the silicon nitride layer, other than the silicon nitride layer in opening 104 and a portion of the silicon nitride layer on source electrode 201, is removed using a photolithography method and dry etching to leave only the silicon nitride layer inside opening 104. With this, intermediate layer 105 made of the silicon nitride layer is formed so as to cover the internal surface of opening 104 and the portion on source electrode 201.

Formation of intermediate layer 105 as described above can inhibit creation of a step height at an interface portion between the surface of nitride semiconductor layer 103 and the surface of intermediate layer 105, as compared to the above-described Embodiment 1. With this, it is possible to inhibit an occurrence of a void between nitride semiconductor layer 103 and intermediate layer 105 caused by the step height.

Figure 6E:
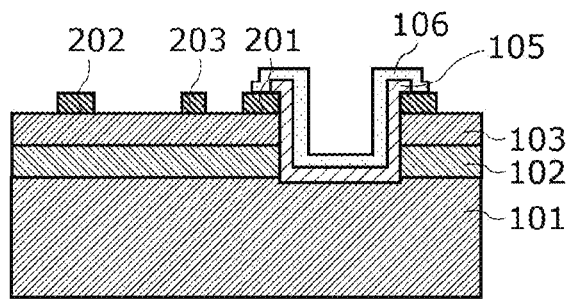
FIG. 6E is a diagram illustrating a process of forming a metal layer above the intermediate layer in the method for manufacturing the semiconductor device according to the variation of Embodiment 1.
Figure 6F:
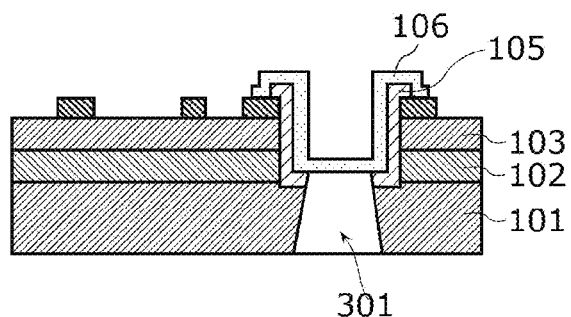
FIG. 6F is a diagram illustrating a process of forming a through via that penetrates the Si substrate and the intermediate layer in the method for manufacturing the semiconductor device according to the variation of Embodiment 1.
Figure 6G:
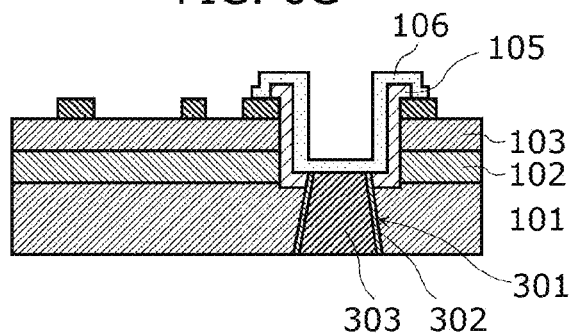
FIG. 6G is a diagram illustrating a process of forming a conductor in the through via in the method for manufacturing the semiconductor device according to the variation of Embodiment 1.
Figure 6H:
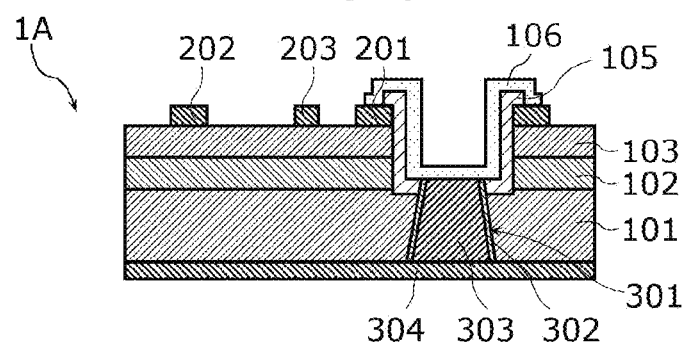
FIG. 6H is a diagram illustrating a process of forming a back electrode on the Si substrate in the method for manufacturing the semiconductor device according to the variation of Embodiment 1.

Thereafter, as illustrated in FIG. 6E, metal layer 106 is formed above opening 104 so as to cover intermediate layer 105. Next, as illustrated in FIG. 6F, through via 301 that penetrates Si substrate 101 and intermediate layer 105 is formed from the lower surface side (back surface side) of Si substrate 101, using metal layer 106 as a stopper. Next, as illustrated in FIG. 6G, conductor 303 is formed inside through via 301. Next, as illustrated in FIG. 6H, back electrode 304 is formed below Si substrate 101. The processes shown in FIG. 6E through FIG. 6H can be performed in the same manner as the processes shown in FIG. 3E through FIG. 3H according to the above-described Embodiment 1.

Through the above-described series of processes, semiconductor device 1A having the configuration shown in FIG. 4 and FIG. 5 can be achieved.

As has been described above, semiconductor device 1A according to the present variation produces the same advantageous effects as the advantageous effects produced by semiconductor device 1 according to the above-described Embodiment 1. For example, in the present variation, semiconductor device 1A is also provided with intermediate layer 105 that is a metal nitride layer or a silicon oxide layer in opening 104 that creates an opening in SiC layer 102. With this, through via 301 that penetrates Si substrate 101 and SiC layer 102 can be readily formed without an occurrence of a notch.

Embodiment 2

Figure 7:
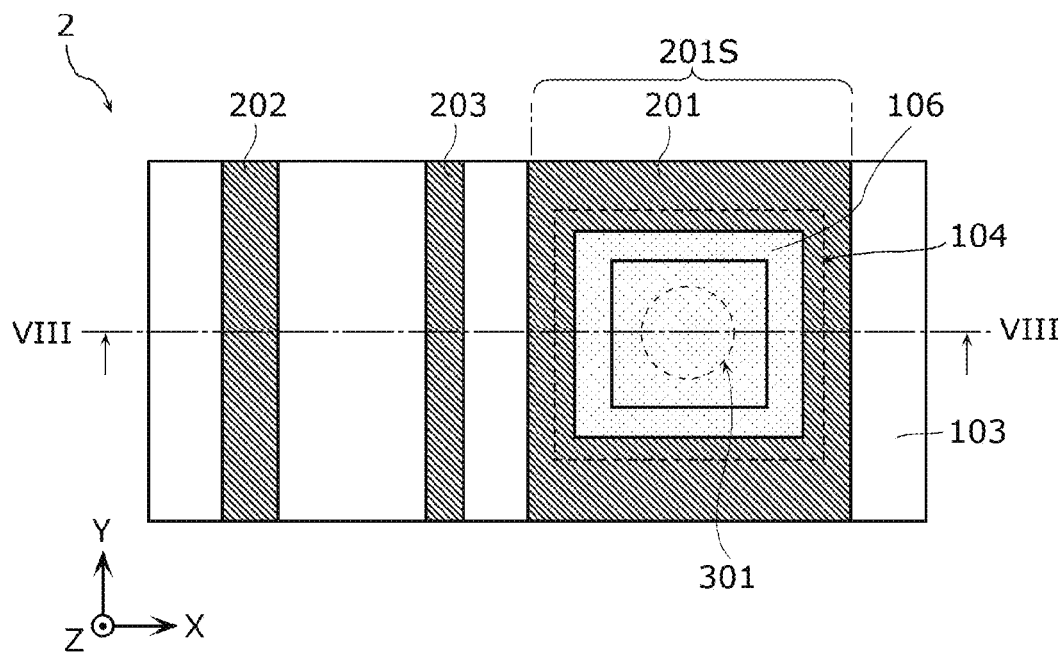
FIG. 7 is a plan view of a semiconductor device according to Embodiment 2.
Figure 8:
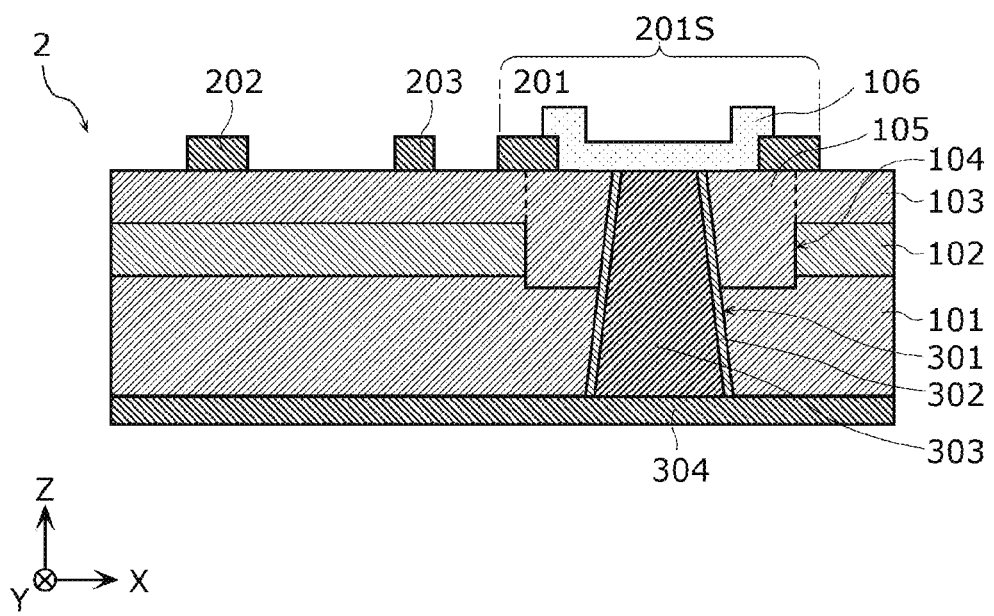
FIG. 8 is a cross sectional view of the semiconductor device FIG. 8 according to Embodiment 2, taken along line VIII-VIII shown in FIG. 7.

Next, semiconductor device 2 according to Embodiment 2 will be described. First, a configuration of semiconductor device 2 according to Embodiment 2 will be described with reference to FIG. 7 and FIG. 8. FIG. 7 is a plan view of semiconductor device 2 according to Embodiment 2. FIG. 8 is a cross sectional view of semiconductor device 2 according to Embodiment 2, taken along line VIII-VIII shown in FIG. 7. Note that in FIG. 8, source electrode 201, drain electrode 202, and gate electrode 203 are hatched for convenience in easily identifying the positions of these electrodes, in the same manner as FIG. 1.

Semiconductor device 2 according to the present embodiment and semiconductor device 1 according to the above-described Embodiment 1 have differences in the configurations of opening 104 and intermediate layer 105.

Specifically, in the above-described Embodiment 1, opening 104 is provided so as to create an opening in SiC layer 102 and nitride semiconductor layer 103, but in the present embodiment, opening 104 does not create an opening in nitride semiconductor layer 103, and creates an opening only in SiC layer 102. In the present embodiment, it should be noted that opening 104 is also provided so as to cause Si substrate 101 to be exposed.

In the above-described Embodiment 1, intermediate layer 105 is formed along the internal surface of opening 104, but in the present embodiment, intermediate layer 105 is formed such that opening 104 is filled with intermediate layer 105. Accordingly, the upper surface of intermediate layer 105 is flush with the upper surface of nitride semiconductor layer 103. Moreover, in the present embodiment, intermediate layer 105 includes a group III nitride semiconductor. In other words, in the present embodiment, intermediate layer 105 and nitride semiconductor layer 103 both include a group III nitride Specifically, intermediate layer 105 and nitride semiconductor. semiconductor layer 103 have the same configuration, and are each a stacked structure of multiple semiconductor layers each of which is made of a group III nitride semiconductor. With this, intermediate layer 105 and nitride semiconductor layer 103 can be simultaneously formed in the same process. Note that an impurity, such as fluorine (F) or boron fluoride ($BF_2$), may be put into nitride semiconductor layer 103 to deactivate a two dimensions electron gas inside nitride semiconductor layer 103.

Moreover, providing intermediate layer 105 such that opening 104 is filled with intermediate layer 105 can reduce a global step height, as compared to opening 104 according to Embodiment 1. In other words, a wiring layer can be readily formed above source area 201S.

In the present embodiment, it should be noted that metal layer 106 is also located above opening 104, and also covers conductor 303, intermediate layer 105, and a portion of source electrode 201.

Next, a method for manufacturing semiconductor device 2 according to Embodiment 2 will be described with reference to FIG. 9A through FIG. 9H. FIG. 9A through FIG. 9H are diagrams illustrating processes of the method for manufacturing semiconductor device 2 according to Embodiment 2.

Figure 9A:
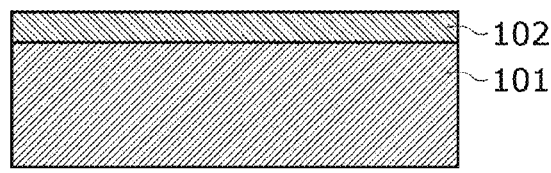
FIG. 9A is a diagram illustrating a process of forming a SiC layer on a Si substrate in a method for manufacturing the semiconductor device according to Embodiment 2.

First, as illustrated in FIG. 9A, SiC layer 102 is formed above Si substrate 101. Specifically, SiC layer 102 is formed by causing 3C—SiC that is a (111) plane having a thickness of 2 μm to epitaxially grow on the surface of Si substrate 101.

Figure 9B:
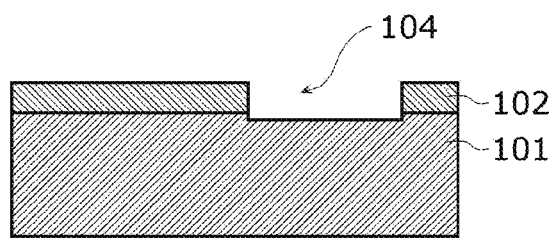
FIG. 9B is a diagram illustrating a process of forming an opening in the SiC layer in the method for manufacturing the semiconductor device according to Embodiment 2.

Next, as illustrated in FIG. 9B, opening 104 that creates an opening in SiC layer 102 is formed. Specifically, using a lithography method and an etching method, SiC layer 102 is removed by etching to form opening 104 that penetrates SiC layer 102 and to cause Si substrate 101 to be exposed.

Figure 9C:
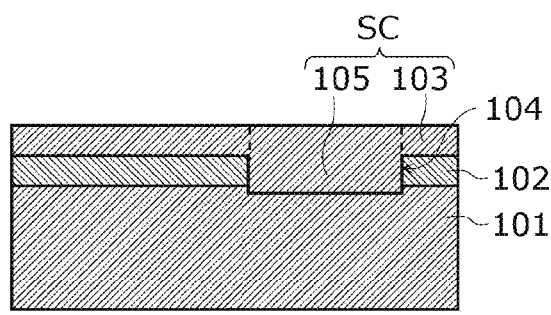
FIG. 9C is a diagram illustrating a process of forming an intermediate layer and a nitride semiconductor layer in the method for manufacturing the semiconductor device according to Embodiment 2.

Next, as illustrated in FIG. 9C, nitride semiconductor layer 103 is formed above SiC layer 102, along with the formation of intermediate layer 105 in opening 104. Specifically, nitride semiconductor layer SC having a thickness of 5 μm is formed on the surface of SiC layer 102 and the surface of Si substrate 101 that is exposed due to opening 104 by causing a stacked structure of a plurality of semiconductor layers made of group III nitride semiconductors to epitaxially grow. In this case, nitride semiconductor layer SC that is formed such that opening 104 is filled with nitride semiconductor layer SC has low crystallinity, as compared to nitride semiconductor layer SC formed on SiC layer 102. For this reason, nitride semiconductor layer SC on SiC layer 102 turns out to be nitride semiconductor layer 103 that includes group III nitride semiconductors having high crystallinity, and nitride semiconductor layer SC inside opening 104 turns out to be intermediate layer 105 that includes group III nitride semiconductors having low crystallinity and many dislocations. In other words, in the present embodiment, nitride semiconductor layer 103 and intermediate layer 105 both include group III nitride semiconductors, but have a difference in crystallinity. Note that nitride semiconductor layer 103 includes, within the layers, a two dimensions electron gas layer that serves as carriers of a transistor.

Figure 9D:
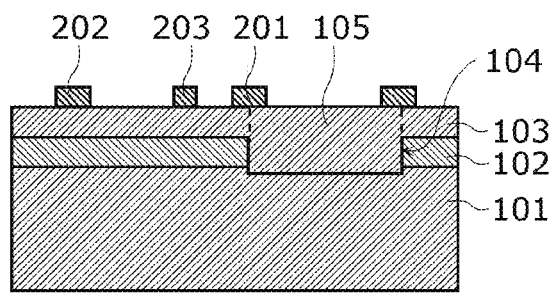
FIG. 9D is a diagram illustrating a process of forming a source electrode, a drain electrode, and a gate electrode in the method for manufacturing the semiconductor device according to Embodiment 2.

Next, as illustrated in FIG. 9D, source electrode 201, drain electrode 202, and gate electrode 203 are formed above nitride semiconductor layer 103. Specifically, a Ti layer and an Al layer each of which has been patterned by a photoresist are sequentially stacked on the surface of nitride semiconductor layer 103 using an evaporation method. Then, after the Ti layer and the Al layer are patterned by a lift-off process, an alloying process takes place by heat treatment to form source electrode 201 and drain electrode 202 which are ohmically connected with a two dimensions electron gas inside nitride semiconductor layer 103.

Thereafter, a Ni layer and a Au layer each of which has been patterned by a photoresist are sequentially stacked using an evaporation method. Then, after the Ni layer and the Au layer are patterned by a lift-off process, gate electrode 203 that is in Schottky junction with the two dimensions electron gas inside nitride semiconductor layer 103 is formed. In the present embodiment, gate electrode 203 is also formed between source electrode 201 and drain electrode 202.

Note that source electrode 201 may be formed over opening 104 in plan view. With this, a pit is formed in the interface portion between intermediate layer 105 and nitride semiconductor layer 103. Accordingly, a contact resistance between source electrode 201 and the two dimensions electron gas layer is reduced.

Figure 9E:
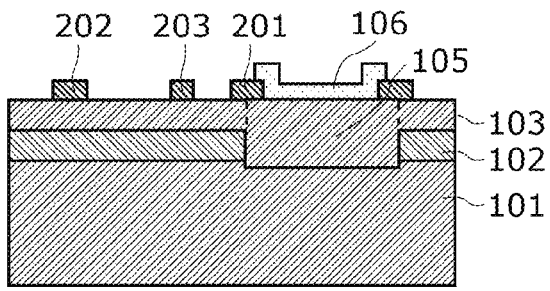
FIG. 9E is a diagram illustrating a process of forming a metal layer above the intermediate layer in the method for manufacturing the semiconductor device according to Embodiment 2.
Figure 9F:
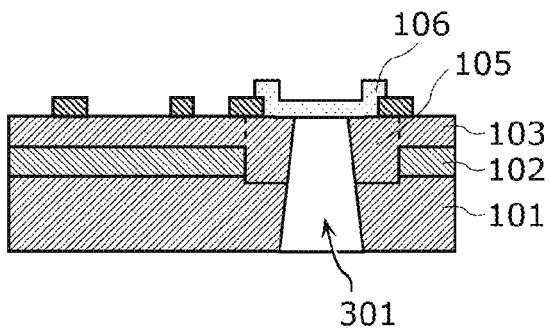
FIG. 9F is a diagram illustrating a process of forming a through via that penetrates the Si substrate and the intermediate layer in the method for manufacturing the semiconductor device according to Embodiment 2.
Figure 9G:
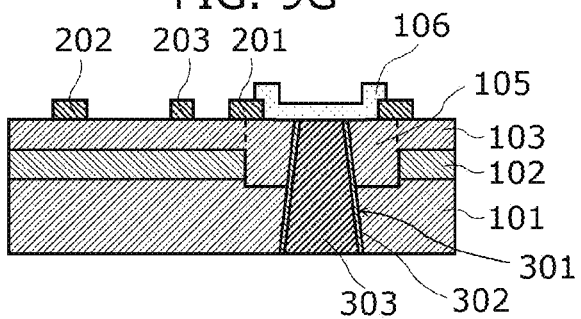
FIG. 9G is a diagram illustrating a process of forming a conductor in the through via in the method for manufacturing the semiconductor device according to Embodiment 2.
Figure 9H:
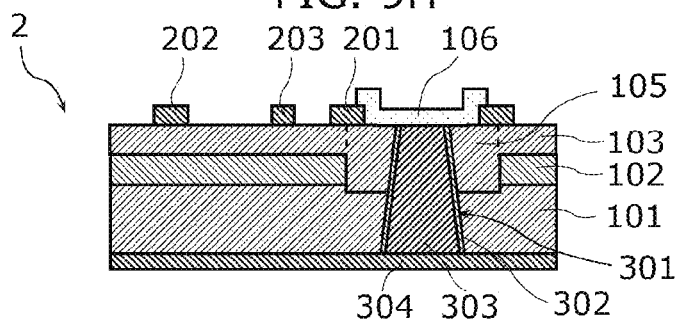
FIG. 9H is a diagram illustrating a process of forming a back electrode on the Si substrate in the method for manufacturing the semiconductor device according to Embodiment 2.
Figure 10:
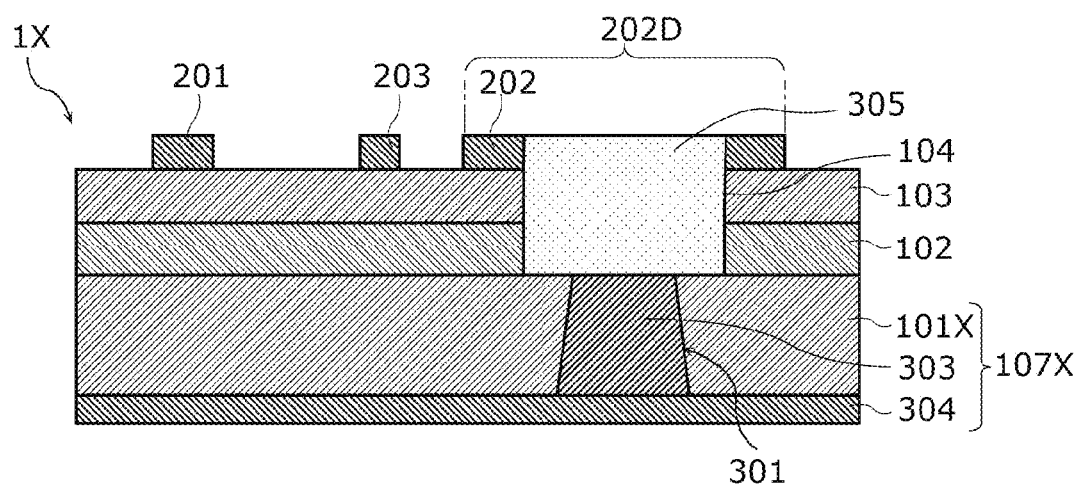
FIG. 10 is a cross sectional view of a nitride semiconductor device disclosed by PTL 1.
Figure 11:
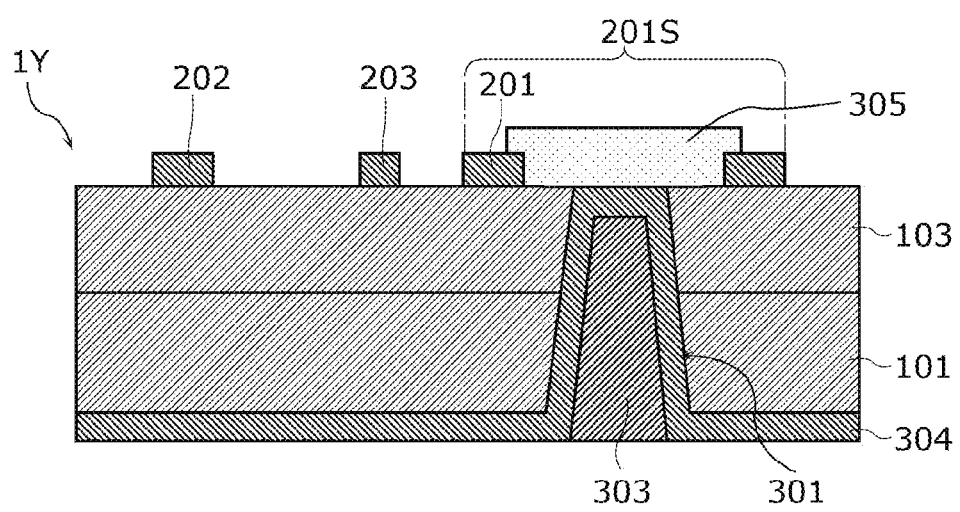
FIG. 11 is a cross sectional view of a nitride semiconductor device disclosed by PTL 2.

Thereafter, as illustrated in FIG. 9E, metal layer 106 is formed above opening 104 so as to cover intermediate layer 105. Next, as illustrated in FIG. 9F, through via 301 that penetrates Si substrate 101 and intermediate layer 105 is formed from the lower surface side (back surface side) of Si substrate 101, using metal layer 106 as a stopper. Next, as illustrated in FIG. 9G, conductor 303 is formed inside through via 301. Next, as illustrated in FIG. 9H, back electrode 304 is formed below Si substrate 101. The processes shown in FIG. 9E through FIG. 9H can be performed in the same manner as the processes shown in FIG. 3E through FIG. 3H according to the above-described Embodiment 1.

Through the above-described of series processes, semiconductor device 2 having the configuration shown in FIG. 7 and FIG. 8 can be achieved.

As has been described above, semiconductor device 2 according to the present embodiment produces the same advantageous effects as the advantageous effects produced by semiconductor device 1 according to the above-described Embodiment 1. For example, semiconductor device 2 according to the present embodiment is also provided with intermediate layer 105 that is a metal nitride layer or a silicon oxide layer in opening 104 that creates an opening in SiC layer 102. With this, through via 301 that penetrates Si substrate 101 and SiC layer 102 can be readily formed without an occurrence of a notch.

Moreover, in semiconductor device 2 according to the present embodiment, intermediate layer 105 includes group III nitride semiconductors in the same manner as nitride semiconductor layer 103.

With this configuration, intermediate layer 105 and nitride semiconductor layer 103 can be simultaneously formed. Accordingly, semiconductor device 2 including intermediate layer 105 can be manufactured at low cost.

Other Variations

Hereinbefore, the semiconductor device according to the present disclosure has been described based on Embodiments 1 and 2, but the present disclosure is not limited to the above-described Embodiments 1 and 2.

For example, the present disclosure also encompasses: embodiments achieved by applying various modifications conceivable to those skilled in the art to the above-described Embodiments 1 and 2; and embodiments achieved by optionally combining the elements and the functions of Embodiments 1 and 2 without departing from the spirit of the present disclosure. The present disclosure also encompasses claims achieved by optionally combining, without causing technical contradictions, two or more claims selected from among the claims recited in CLAIMS at the time of filing the present application. For example, when the dependent claims recited in CLAIMS of the present application at the time of filing the present application are written as multiple dependent claims or multiple-multiple dependent claims so as to depend from all claims having broader concepts, the present disclosure also encompasses all of combinations of claims included in these multiple dependent claims or multiple-multiple dependent claims.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful for communication devices and inverters requiring high-speed operation, and power switching elements and the like used for power-supply circuits, etc.

The invention claimed is:

1. A semiconductor device comprising:
    a Si substrate;
    a back electrode provided below the Si substrate;
    a SiC layer provided above the Si substrate;
    a semiconductor layer provided above the SiC layer and made of a group III nitride semiconductor;
    a source electrode and a drain electrode provided above the semiconductor layer;
    a gate electrode in contact with the semiconductor layer;
    an intermediate layer provided in an opening that is formed in at least the SiC layer;
    a metal layer provided above the opening; and
    a conductor provided inside a through via that passes through the intermediate layer and the Si substrate, and electrically connected with the back electrode and the metal layer, wherein
    the metal layer covers the through via,
    the intermediate layer is provided between the SiC layer and the conductor,
    the intermediate layer is a metal nitride layer or a silicon oxide layer,
    the opening has a bottom from which the Si substrate is exposed, and
    the intermediate layer is separated from the back electrode.

2. The semiconductor device according to claim 1, wherein
    a side surface of the through via inclines with respect to a normal direction of the substrate, and
    a top area of the through via in contact with the metal layer is smaller than a bottom area of the through via in contact with the back electrode.

3. The semiconductor device according to claim 1, wherein the intermediate layer includes a group III nitride semiconductor.

4. The semiconductor device according to claim 3, wherein
    the intermediate layer has an upper surface that is substantially flush with an upper surface of the semiconductor layer.

5. The semiconductor device according to claim 1, wherein
    the metal layer contains at least one metal selected from among Cu, Au, Pt, Ni, and Mo.

6. The semiconductor device according to claim 1, wherein
    the metal layer contains at least one metal selected from among W, Ti, and Ta.

7. The semiconductor device according to claim 1, wherein
    the metal layer and the source electrode are electrically connected.

8. The semiconductor device according to claim 1, wherein the source electrode is provided above a source area in the semiconductor layer, and the through via is provided in the source area.

9. The semiconductor device according to claim 1, wherein the metal layer has a lowermost surface whose width is greater than an opening width in an uppermost surface of the through via.

10. The semiconductor device according to claim 1, further comprising:

a metal diffusion prevention film that covers a side surface of the conductor and directly contacts the conductor, the intermediate layer and the substrate.

* * * * *